United States Patent
Akaogi

[19]

[11] Patent Number: 6,157,327
[45] Date of Patent: Dec. 5, 2000

[54] ENCODING/DECODING DEVICE

[75] Inventor: Kazunari Akaogi, Chiba, Japan

[73] Assignee: Kawasaki Steel Corporation, Hyogo, Japan

[21] Appl. No.: 09/040,274

[22] Filed: Mar. 18, 1998

[30] Foreign Application Priority Data

Mar. 21, 1997 [JP] Japan ................................. 9-067808

[51] Int. Cl.⁷ .................................................. H03M 7/40
[52] U.S. Cl. ............................................................ 341/67
[58] Field of Search .................................. 341/65, 67

[56] References Cited

U.S. PATENT DOCUMENTS

| | | | |
|---|---|---|---|
| 5,714,949 | 2/1998 | Watabe | 341/67 |
| 5,801,650 | 9/1998 | Nakayama | 341/67 |
| 5,841,381 | 11/1998 | Nakayama | 341/67 |
| 5,912,742 | 6/1999 | Matoba et al. | 348/420 |

*Primary Examiner*—Howard L. Williams
*Attorney, Agent, or Firm*—Oliff & Berridge, PLC.

[57] ABSTRACT

To order to provide an encoding/decoding device capable of reducing the memory area required and speeding up encoding processing, an encoding/decoding device according to the invention includes a data encoder for reading a size representing a code length of each code word stored in memory, and an offset representing the numerical difference between a base, representing a minimum or maximum value in code words having the code length represented by this size, and the code word, using an address designated by a run length and a group number, outputting a minimum or maximum value in a code word having a code length designated by the size with a multiplexer, adding the base and the offset, and outputting a code of a code word corresponding to the run length and group number.

12 Claims, 3 Drawing Sheets

ENCODING/DECODING DEVICE

BACKGROUND OF THE INVENTION

1. Field of the Invention

The invention relates to an encoding/decoding device for transforming data that includes of a plurality of coefficients continuously concatenated into a variable length code.

2. Description of the Related Art

In the electronic media device industry, which includes facsimile machines and remote telecommunication conference systems which transform image data into digital information by sampling and transmitting it to a remote location, the demand for improved image quality is continually increasing. For example. certain binary monochrome images have been enhanced to multiple gray-scale images, and more recently to color images.

Generally, the quantity of information in image data is very large, particularly, in multiple gray-scale Image data and color image data. For this reason, when image data is transmitted to a remote location and is saved, a data compression technique is used for compressing the image data.

For example, it is possible to compress the quantity of information with little or no degradation of image quality so that any degradation is unidentifiable to the human eye by deleting the high-frequency component of the image data which human eyes can barely identify. Thus. the image data is compressed by deleting the high-frequency component which cannot be detected by the human eye.

One data compression technique of this type is the JPEG (Joint Photographic Experts Group) algorithm which is n international standard coding method for color still images. As shown In FIG. 3. in the DCT (Discrete Cosine Transform) method of the JPEG algorithm. encoding and decoding of image data is performed by a block by dividing original image data into blocks, each of which includes 8 horizontal pixel ×8 vertical pixels. Thus, the encoding and decoding of image data is performed by a block composed of 64 pixels.

First, encoding of the original image data is performed with a data encoder 34. In the data encoder 34, a DCT circuit 36 performs the discrete cosine transform for each pixel value of each block. and thereafter. a quantization circuit 38 quantizes the transformed block on the basis of a quantization table 40. Then, an entropy coding circuit 42 performs, for example, Huffman coding to the quantized block for compression based of a coding table 44. The original image data variable-length coded in this manner is transmitted. for example. via a transmission line.

In contrast, decoding of the original image data is performed with a data decoder 46. In the data decoder 46, an entropy decoding circuit 48 performs Huffman decoding for each pixel value of each block, which is variable-length coded and is made to be a data stream, using the coding table 44, which is the same table utilized for encoding. Next, an inverse quantization circuit 50 performs inverse quantization to the decoded values using the quantization table 40, which is the same table utilized for quantizing. After that. an inverse DCT circuit 52 performs the inverse discrete cosine transform for decompression, and a decoded image data is obtained.

Here, among the 64 coefficients obtained by performing the DCT transform for a block of 8 horizontal pixels (X=0–7)×8 vertical pixels (Y=0–7), that is, 64 pixels (PXY). the coefficient $S_{00}$ is called a DC component, and the residual sixty-three coefficients are called AC components.

The DC component shows an average value (a direct-current component) of the sixty-four pixels. In Huffman coding/decoding, encoding and decoding are different than the DC component and AC components. respectively.

For example, In Huffman coding, encoding of AC coefficients Is performed by performing zigzag-scanning to quantized data, thereafter obtaining a run length (NNNN) representing a count of coefficients having continuous zeros, and obtaining a group number (SSSS) of the AC coefficients from the values of the AC coefficients that follow zero but are not zero. Further, encoding of the AC coefficients is performed by assigning a code word, each having a code length of one to sixteen bits, according to the run length and group number NNNN/SSSS, and adding additional bits, from 0 bit to 15 bits, to this code word according to the group number.

Here, by illustrating Huffman coding of the JPEG, conventional encoding methods and associated problems are described.

In conventional encoding methods, a memory having a total of twenty bits length and storing a 16-bit code CODE representing each code word, and a 4-bit size SIZE representing code length of each code word in each address is provided for all code words to be encoded. Further, the code CODE and size SIZE, which are stored In the memory, are read and the code CODE whose bit length is equal to the number of bits designated with the size SIZE is used.

For example, if a run length and a group number NNNN/SSSS are 0/4, the code word is "1011" (a binary number; hereinafter, this notation is similarly treated) according to a luminance table recommended by the JPEG and its code length is 4 bits. In this case, the following twenty-bit data is read as the code CODE and size SIZE from the memory.

Code CODE="0000 0000 0000 1011"

Size SIZE="0011"

Here, since sixteen types of code lengths that are 1–16 bits of a code word are represented in 4 bits from "0000" to "1111", the size SIZE is not "0100", but "0011". In addition, only the low-order 4-bit data="1011", which Is designated by the size SIZE="0011", in the code CODE="0000 0000 0000 1011" is used as a code word corresponding to the run length and group number NNNN/SSSS=0/4.

This method has the advantage that it is possible to obtain the code CODE and size SIZE of the code word corresponding to the run length and group number NNNN/SSSS=0/4 by only reading data from the memory once, and hence, encoding the data at high-speed. However, this is problematic because 20-bit data memory storing is necessary in each address, the bit length of the memory becomes large, and hence, a large memory area is required.

In another conventional encoding method, each minimum value in code words having code lengths of one to sixteen bits is defined as a base BASE and is stored in each address of the memory having a 16-bit length. Further, with regard to all code words to be encoded, 4 bits of size SIZE representing a code length of each code word and 8 bits of offset OFFSET representing the numerical difference between a base BASE corresponding to this size SIZE and each code word, that is, 12 bits of data are stored in each address of the memory aside from the 16-bit memory address.

In this method, first, a total twelve bits of size SIZE and offset OFFSET, which are stored in an address designated by the run length and group number NNNN/SSSS, are read. After 16-bits of base BASE stored in an address designated by the size SIZE is read in the next cycle, a code CODE is calculated by adding the offset OFFSET to the base BASE. A bit count of the code CODE to be used is 5 designated by the size SIZE.

Similarly, assuming that the run length and group number NNNN/SSSS=0/4, first, the following twelve bits of data are read from the memory as the size SIZE and offset OFFSET.

Size SIZE="0011"

Offset OFFSET="0000 0001"

Subsequently. with using the size SIZE="0011"read from the memory as an address, the following 16-bits of base BASE are read from the memory.

Base BASE="0000 0000 0000 1010"

Then, the code CODE="0000 0000 0000 1011" is obtained by adding the base BASE="0000 0000 0000 1010" and the offset OFFSET "0000 0001". Only the low-order 4-bit data="1011", which is designated by the size SIZE="0011", In the code CODE="0000 0000 0000 1011" is used as a code word corresponding to the run length and group number NNNN/SSSS=0/4.

This method has the advantage that. since a memory capable of storing at most sixteen-bit data in each address can be used. it is possible to use a memory having small bit length. However, this is problematic because the data must be read twice from the memory, which slows processing. In addition, if another memory Is used as the memory for storing the base BASE, this causes the additional problem of an increased number of memories which increases memory area.

SUMMARY OF THE INVENTION

The invention Is intended to solve the problems in the conventional art as described above. and hence, an object of the invention is to provide an encoding/decoding device capable of reducing a memory area and speeding up encoding processing.

In order to achieve the object described above, the invention provides an encoding/decoding device for transforming data, which includes a plurality of continuously concatenated coefficients, into a variable-length code according to a run length representing a count of coefficients having continuous zeros. and a group number determined from values of coefficients except zero, the encoding/decoding device having a data encoder comprising a memory storing a size representing a code length of each code word, and an offset representing the numerical difference between a base, representing a minimum or maximum value in code words having a code length represented by this size, and each code word, in each address for all code words defined in an encoding/decoding table, and outputting the size and offset that are stored in an address designated by the run length and group number; a group of registers storing minimum or maximum values of code words having respective code lengths defined in the encoding/decoding table: a multiplexer outputting a minimum or maximum value in the code words having the code length designated by the size as the base; and an adder adding this base and the offset.

The encoding/decoding device described above may also Include a data decoder comprising a shifter shifting variable-length coded data according to a code length of a code word corresponding to this data; a flip-flop holding the data outputted from this shifter; a group of registers holding minimum or maximum values of respective code words having predetermined code lengths defined in the encoding/decoding table; a group of comparators comparing the data held in the flip-flop with the minimum or maximum values of respective code words held in the group of registers; and an encoder encoding the code length of the code word corresponding to the data from the comparison result of this group of comparators, where the group of registers in the data encoder are used commonly as the group of registers in the data decoder.

In addition, the invention also provides an encoding/decoding device for transforming data composed of a plurality of continuous coefficients into a variable-length code according to a run length representing a count of coefficients having continuous zeros, and a group number determined from values of coefficients except zero, the encoding/decoding device having a data encoder comprising a memory storing a size representing a code length of each code word, and an offset representing the numerical difference between a base, representing a minimum or maximum value in code words having a code length represented by this size, and each code word, in each address for all code words defined in an encoding/decoding table, and outputting the size and the offset that are stored in the address designated by the run length and group number; a multiplexer outputting the minimum or maximum value in the code words having the code length designated by the size as the base; and an adder adding this base and the offset.

BRIEF DESCRIPTION OF THE DRAWINGS

The invention is described with reference to the following drawings wherein like numerals represent like elements. and wherein.

DETAILED DESCRIPTION OF THE PREFERRED EMBODIMENTS

An encoding/decoding device according to an embodiment of the invention is described below in detail with reference to the drawings.

The encoding/decoding device according to the invention includes a data encoder that encodes data and a data decoder that decodes the encoded data. The present embodiment is described by illustrating Huffman coding of the JPEG so that the invention can easily be compared with a conventional encoding/decoding device that adopts a conventional encoding method.

Figure 1:
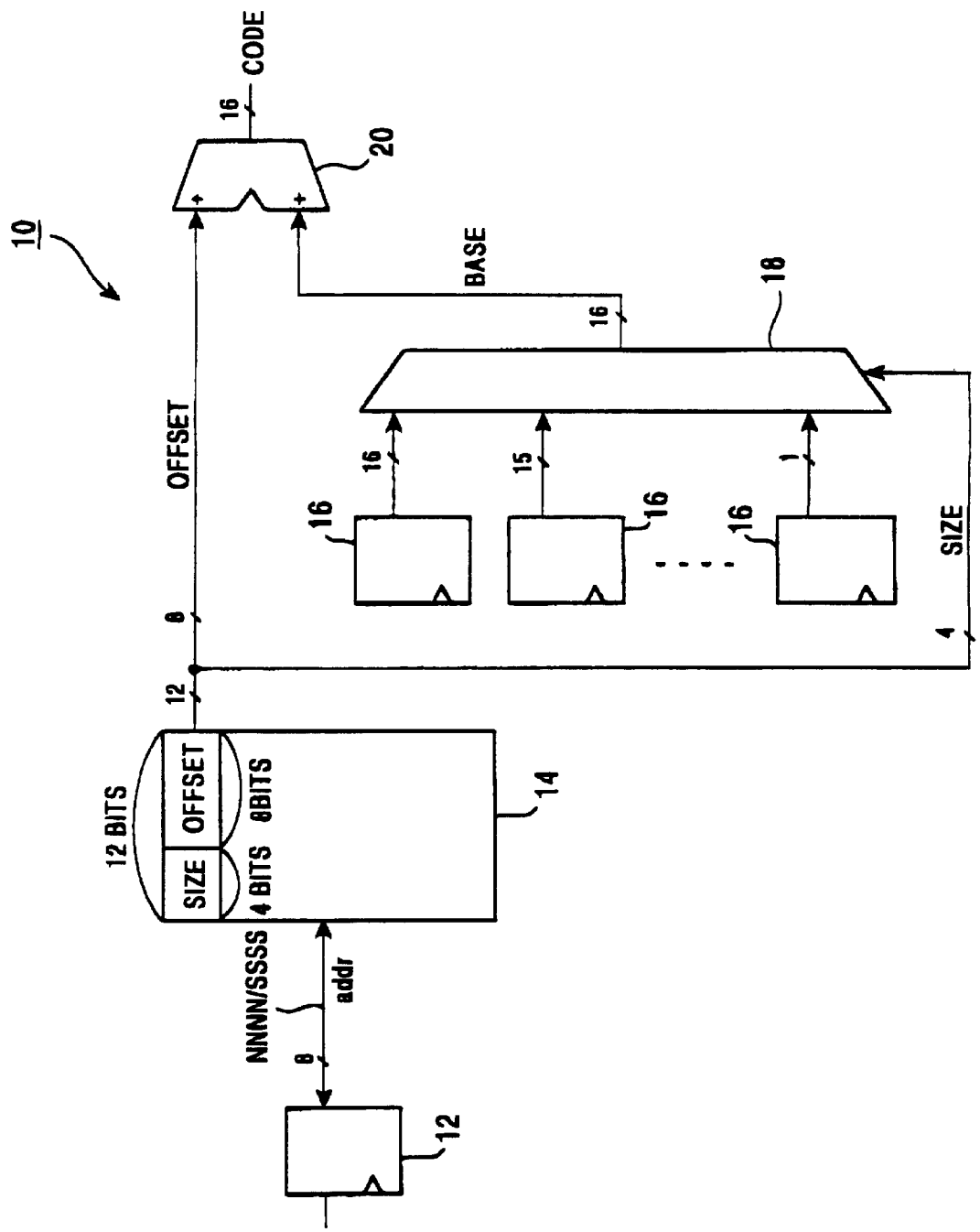
FIG. 1 is a schematic diagram of an encoding/decoding device according to an embodiment of the invention.

FIG. 1 is a schematic diagram of a data encoder according to an embodiment of the invention.

The data encoder 10 shown in FIG. 1 encodes data into a code word having respective code lengths of one to sixteen bits represented In 4 bits according to. for example, a run length and a group number NNNN/SSSS represented in 8 bits. The embodiment shown in FIG. 1 includes a flip-flop 12, memory 14, a group of registers 16, a multiplexer 18, and an adder 20.

The flip-flop 12 according to the present embodiment holds 8-bits of run length and group number NNNN/SSSS, and its output is inputted to an address input terminal addr of the memory 14 as an address signal.

In addition, the memory 14 in this example stores 4-bits of size SIZE representing a code length of each code word, and 8-bits of offset OFFSET representing the numerical difference between a base BASE, representing a minimum or maximum value in code words having a code length represented by this size SIZE, and each code word, in each address for all code words defined in an encoding/decoding table. Moreover, the offset OFFSET can be positive or negative.

The memory 14 outputs a total twelve bits of size SIZE and offset OFFSET which are stored in an address designated by the run length and group number NNNN/SSSS received from the flip-flop 12. In addition, the offset OFFSET is inputted to an input terminal of the adder 20 as an offset value of the base BASE, and the size SIZE is inputted to a selection Input terminal of the multiplexer 18 as a selection signal for selecting one of outputs from the group of registers 16.

Next, the group of registers 16 stores minimum or maximum values of respective code words having respective code lengths defined in the encoding/decoding table. i.e. respective code lengths of one to sixteen bits, all of whose outputs are inputted to the multiplexer 18. In addition, it is apparent that it is necessary to appropriately determine a value of the offset OFFSET stored in each address of the memory 14 according to the minimum or maximum values in code words having respective code lengths stored In the group of registers 16.

In each address of the memory 14, a size SIZE and an offset OFFSET of each code word defined in the encoding/decoding table are stored before the start of data coding. Similarly, in the group of registers 16, the minimum or maximum values of code words defined in the encoding/decoding table are stored before data coding starts. In addition, a method for writing data into the memory 14 and group of registers 16 is not limited.

The multiplexer 18 outputs the minimum or maximum value In the code words having the code length designated by the size among the outputs from the group of registers, where the minimum or maximum values in code words having respective code lengths defined in the encoding/decoding table, i.e. respective code lengths of one to sixteen bits are stored, as the base, that is, 16-bits of base BASE. in this example. The output of the multiplexer 18 is inputted to another input terminal of the adder 20.

Finally, the adder 20 adds the offset OFFSET outputted from the memory 14 to the base BASE outputted from the multiplexer 18, and outputs this addition result as 16-bits of code CODE in this example. In addition, the adder 20 can be utilized, which adds a positive number and a positive number, a positive number and a negative number (two's complement), or a negative number and a negative number. A subtracter can also be used instead of the adder.

In the data encoder 10, first, 8-bits of run length and group number NNNN/SSSS held in the flip-flop 12 is inputted to the address input terminal addr of the memory 14 as an address signal. Accordingly. the memory 14 outputs a total twelve-bits of 4-bit size SIZE and 8-bit offset OFFSET which are stored in an address designated by the run length and group number NNNN/SSSS.

Next, the size SIZE outputted from the memory 14 is inputted into the selection input terminal of the multiplexer 18 as a selection signal. The multiplexer 18 selects the minimum or maximum value in the code words having the code length designated by the 4-bit size SIZE among the outputs from the group of registers 16, where the minimum or maximum values in code words having respective code lengths of one to sixteen bits, and outputs as the 16-bit base BASE.

In addition, the offset OFFSET outputted from the memory 14 and the base BASE outputted from the multiplexer 18 are inputted to the adder 20, where a value of the offset OFFSET is added to a value of the base BASE. The adder 20 outputs the 16-bit code CODE corresponding to the run length and group number NNNN/SSSS as the addition result.

The operation described above is illustrated as follows. For example, if a luminance table indicated by the JPEG is used as the encoding/decoding table and the run length and group number NNNN/SSSS=0/4, the following twelve bits of data are read from the memory as the 4-bit size SIZE and 8-bit offset OFFSET:

Size SIZE="0011"

Offset OFFSET="0000 0001".

Subsequently. for example. if the minimum values in code words having respective code lengths of one to sixteen bits are stored in the group of registers 16, by using the size SIZE="0011" read from the memory 14 as an address, the multiplexer 18 outputs the minimum value in code words having the 4-bits of code length represented by the size SIZE="0011" as the following 16-bits of base BASE:

Base BASE="0000 0000 0000 1010".

Then, the code CODE="0000 0000 0000 1011" is obtained by adding the offset OFFSET "0000 0001" to the base BASE="0000 0000 0000 1010". Only the low-order 4-bit data="1011". which is designated by the size SIZE= "0011", in the code CODE="0000 0000 0000 1011" is used as a code word corresponding to the run length and group number NNNN/SSSS=0/4.

In this manner, the data encoder 10 according to the invention can reduce the bit length of the memory to 12 bits compared to a conventional encoding/decoding device using a memory of 20-bit length. Further, it is sufficient to read data only once from the memory according to the invention, compared to conventional encoding/decoding devices which read data twice from the memory. Thus, the data encoder 10 according to the Invention can significantly reduce the memory area while also speeding up the coding processing.

In addition, the data encoder 10 according to this embodiment is designed so as to correspond to all types of encoding/decoding tables. In contrast, if the encoding/decoding table to be used is determined before processing, it is not always necessary to use the group of registers. Thus, it may be appropriate to output a high or low level signal according to the minimum or maximum value in code words having the code length designated by the size SIZE where every bit of the 16-bit base BASE outputted from the multiplexer 18.

In Japanese Patent Application No. 9-21551, the present Applicant proposed a data decoder capable of determining the code length of a code word at high-speed with greatly reduced circuit size when a variable-length coded data stream is decoded. The encoding/decoding device according to the present invention has an advantage that it is possible to further reduce the circuit size if the data decoder proposed in the Japanese Patent Application No. 9-21551 is used as the date decoder.

Figure 2:
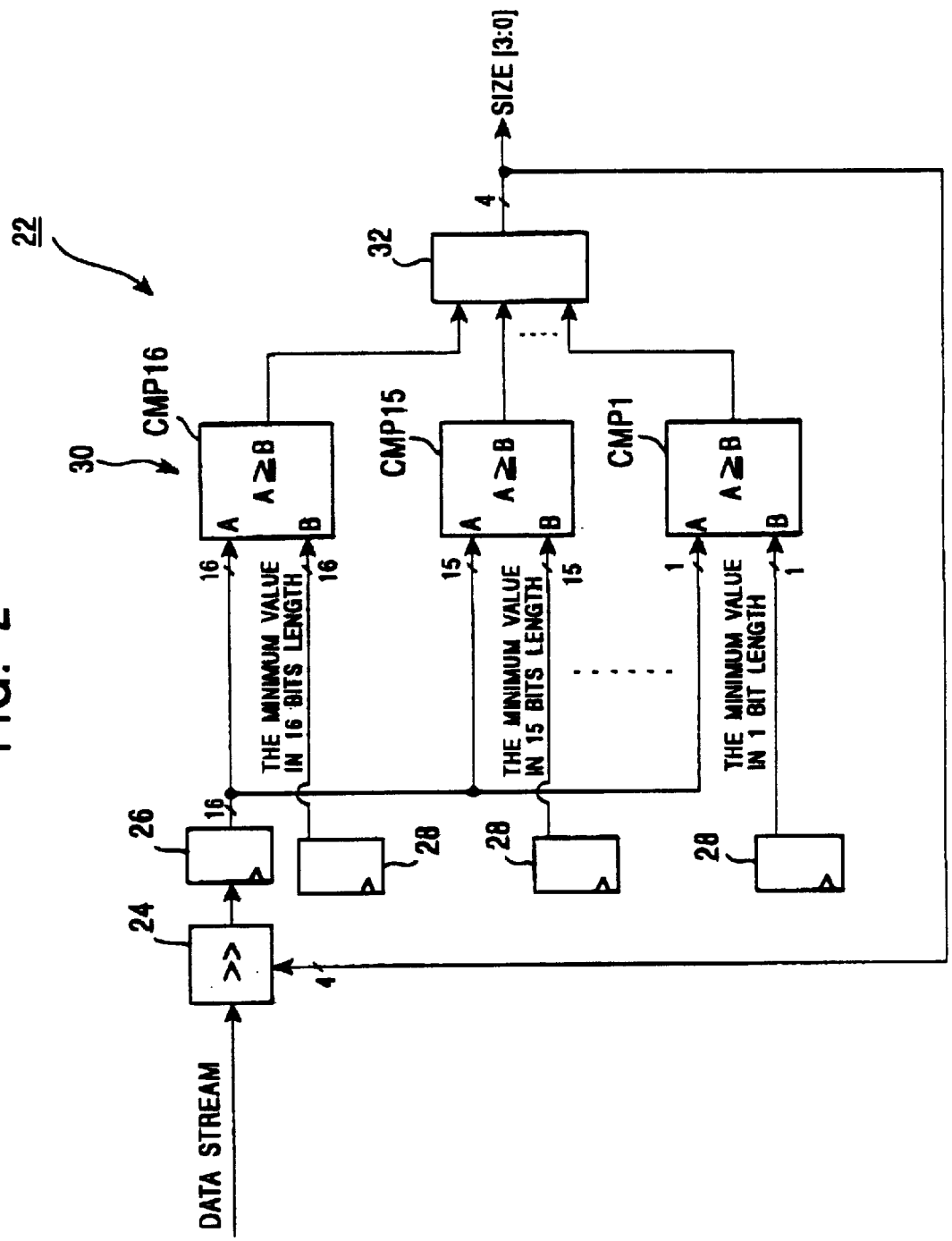
FIG. 2 is a schematic diagram of a data decoder according to an embodiment of the invention.
Figure 3:
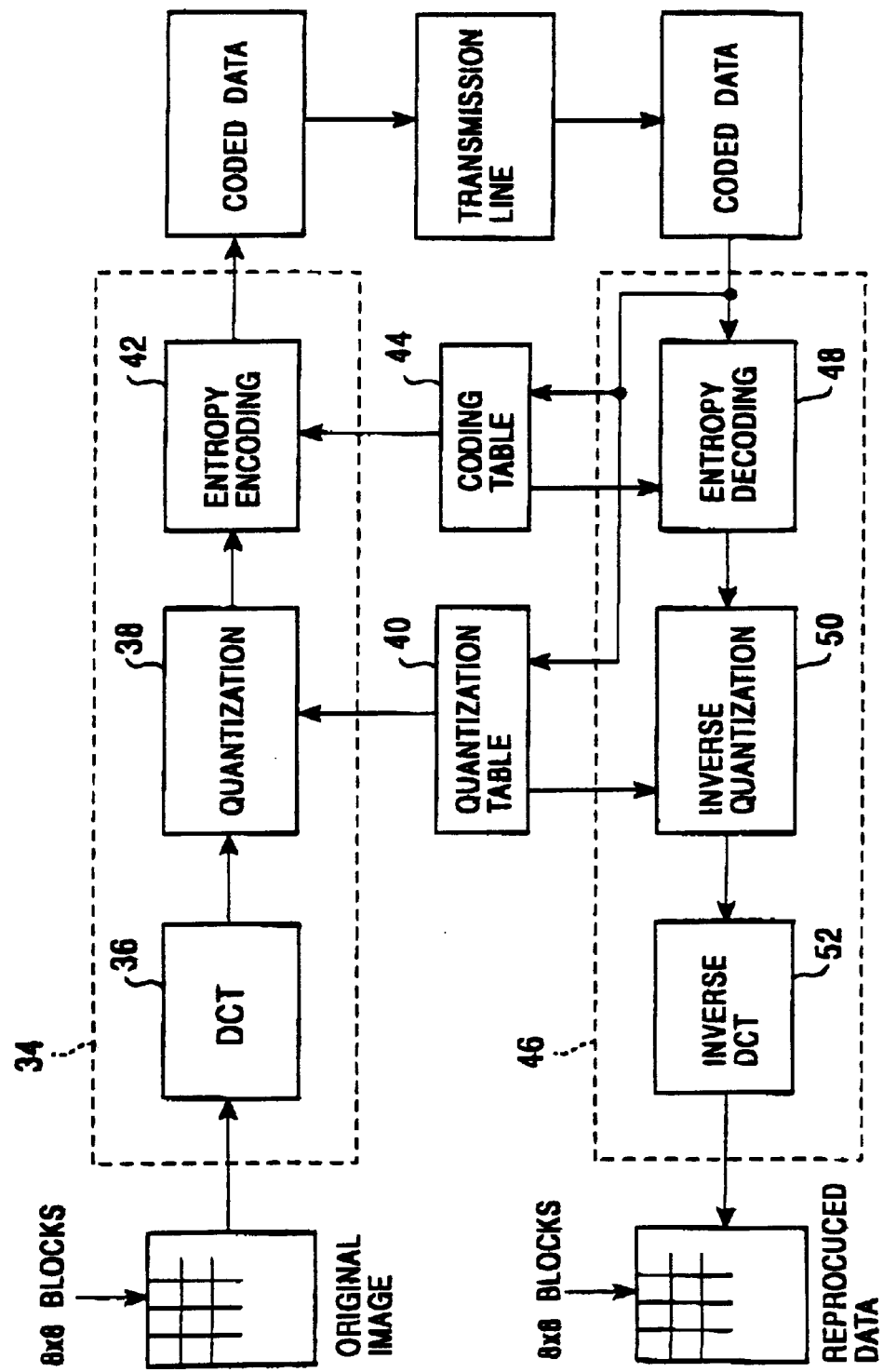
FIG. 3 is a block diagram illustrating encoding/decoding in the DCT method of the JPEG algorithm.

The data decoder that the present Applicant proposed in Japanese Patent Application No. 9-21551 is described below with reference to FIG. 2. FIG. 2 is a schematic diagram of an embodiment of a data encoder that the present Applicant disclosed in Japanese Patent Application No. 9-21551. The data decoder 22, for example, obtains code lengths of respective code words when a variable-length coded data stream which is code words having respective code lengths of one to sixteen bits represented in 4 bits is decoded. In addition. the data decoder 22 includes a shifter 24, a flip-flop 26, a group of registers 28, a group of comparators 30 (CMP16, CMP15, . . . , CMP1), and an encoder 32.

The shifter 24 accepts the variable-length coded data stream, whose output is inputted to the flip-flop 26. Input terminals A and B of the comparator 30 accept an output of the flip-flop 26 and an output of the group of registers 28, respectively, whose output is inputted to the encoder 32. In addition, an output of the encoder 32 is not only inputted to the shifter 24, but also outputted as a 4-bit code SIZE[3:0] representing the code length of the code word.

Here, the shifter 24 shifts data to be variable-length coded and made part of the data stream according to the code length of the code word corresponding to this data. Hence, the shifter 24 in this example outputs the data that is the first to sixteenth bit of the shifted data stream. The flip-flop 26 holds the data outputted from the shifter 24, i.e., 16-bits of data in the present embodiment.

Next, the group or registers 28 holds the minimum or maximum values in code words having respective code lengths defined in the encoding/decoding table, i.e., in this embodiment the minimum values in code words have respective code lengths of one to sixteen bits.

Before decoding the data, the group of registers 28 holds the minimum or maximum values in respective code words having predetermined code lengths defined in the encoding/ decoding table used for encoding/decoding, i.e. in this embodiment minimum values in code words having respective code lengths of one to sixteen bits.

The group of comparators 30 compare the data held in the flip-flop 26 and the minimum or maximum values in respective code words that are held in the group of registers 28 and have predetermined code lengths defined in the encoding/ decoding table. In this example, the group of comparators 30 compare the data held in the flip-flop 26 and the minimum values of respective code words having respective code lengths of one to sixteen bits to detect that the data held in the flip-flop 26 is not less than the minimum values of respective code words.

The encoder 32 encodes the code length of the code word corresponding to the data held in the flip-flop 26 from the comparison result of the group of comparators 30.

In the data decoder 22, the inputted data stream to first shifted by the shifter 24, and the first to sixteenth bit of data Is outputted. The 16-bits of data outputted from the shifter 24 is held in the flip-flop 26, and is inputted to input terminals A of the respective comparators 30 by the data of the bit lengths according to the bit lengths compared by respective comparators 30.

On the other hand, input terminals B of the group of comparators 30 accept outputs of the group of registers 28, that is, the minimum values of respective code words having respective code lengths of one to sixteen bits defined in the encoding/decoding table, respectively.

For example, the comparator 30 (CMP16) accepts the first to fifth bit of data in the 16-bits of data that is held in the flip-flop 26 and the minimum value in code words having 5-bits of code length that is held in the group of registers 28.

The group of comparators 30 compare the data beginning from the first bit of the 16-bits of data held in the flip-flop 26 and having the bit lengths corresponding to the bit counts, which the respective comparators 30 (CMP16, CMP15, . . . , CMP1) compare, to the minimum values of code words that are held in respective registers 28 and have respective code lengths. Further, the group of comparators 30 output the comparison result according to the code lengths of the code words corresponding to the data held in the flip-flop 26.

The comparison result outputted from the group of comparators 30 is inputted to the encoder 32. which encodes the code length of the code word corresponding to the data held in the flip-flop 26 into a 4-bit code SIZE[3:0].

The code-length code SIZE[3:0] encoded by the encoder 32 is fed back to the shifter 24, which shift a data stream according to the code-length code SIZE[3:0]. The operation described above is then repeated.

In the data decoder 22, when a variable-length coded data stream is decoded, a code-length code is not determined by gradually dividing it by the bit. Thus, the code-length code is encoded by simultaneously comparing the data held in the flip-flop 26 and the minimum values in code words that are held in the group of registers 28 and have respective code lengths. Thus, the decoder has the advantage that it is possible to greatly speed up processing by reducing unnecessary processing.

As described above, the data decoder 22 which is described in the Applicant's Japanese Patent Application No. 9-21551 is provided with a group of registers 28 holding the minimum or maximum values in respective code words having predetermined code lengths defined in the encoding/ decoding table. This group of registers 28 perform the same roll as that of the group of registers 16 used in the data encoder 10 shown in FIG. 1.

By using the data decoder, which the present Applicant proposed in Japanese Patent Application No. 9-21551, as a data decoder for the encoding/decoding device according to the present invention, it becomes possible to use the group of registers 16 in the data encoder 10 commonly as the group of registers 28 in the data decoder 22. Therefore, it is possible to reduce circuit size and significantly speed up processing of the data encoder and data decoder in the same hardware.

The encoding/decoding device according to the present invention has a data encoder that reads a size and an offset, which are stored in memory, from an address designated by a run length and a group number, outputs the minimum or maximum value in code words having a code length designated by the size among the minimum or maximum values in code words that are stored in a group of registers and having respective code lengths, and outputs a code of a code word according to the run length and group number by adding the base and offset.

The encoding/decoding device according to the present invention reduces the memory area by decreasing the bit length of memory for storing the minimum or maximum values of code words, which become a base and have respective code lengths, not in memory but in group of registers. At the same time, the device also speeds up coding processing since data reading from the memory occurs only once. In addition, according to the encoding/decoding device of the present invention, it is possible to commonly use group of registers for a data encoder and a data decoder. Thus, it is possible to significantly reduce circuit size and to greatly speed up processing of the data encoder and data decoder in the same hardware.

While this invention has been described in conjunction with specific embodiments thereof, it is evident that many alternatives, modifications and variations will be apparent to those skilled in the art. Accordingly, preferred embodiments of the invention as set forth herein are Intended to be illustrative. not limiting. Various changes can be made without departing from the spirit and scope of the invention as defined in the following claims.

What is claimed is:

1. A data encoding device for use with an encoding/ decoding device that transforms data that includes a plurality of continuous coefficients into a variable-length code based on a run length and a group number, the encoding device comprising:

first storage means for storing a size representing a code length for each code word of each of a plurality of code words, and an offset representing a numerical difference between a base and each of the plurality of code words, the base representing a minimum or maximum value in the code words having a code length represented by the size, for all code words defined in an encoding/decoding table, the first storage means for outputting said size and said offset based on said run length and the group number;

second storage means, different from said first storage means, for storing minimum or maximum values of the code words having respective code lengths defined in said encoding/decoding table;

selection means for receiving the size from the first storage means and for selecting and outputting a selected maximum or minimum value from the second storage means as said base; and logic means for adding said base output from the selection means and said offset output from the first storage means.

2. The data encoding device according to claim 1, wherein said first storage means comprises a memory device that stores, for each code word defined in an encoding/decoding table, the size representing a code length of the code word and an offset representing the numerical difference between a base and the code word, each address of said memory is designated by said run length and the group number.

3. The data encoding device according to claim 1, wherein said second storage means comprises a group of registers storing the minimum or maximum values of the code words having respective code lengths defined in said encoding/decoding table.

4. The data encoding device according to claim 1, wherein said second storage means comprises a group of registers storing the minimum or maximum values of the code words having respective code lengths defined in said encoding/decoding table, the group of registers constantly outputting the minimum or maximum values of code words having said respective code lengths.

5. The data encoding device according to claim 1, wherein said selection means comprises a multiplexer selecting and outputting the selected minimum or maximum value as said base from respective outputs of said second storage means using said size output from the first staring means.

6. The data encoding device according to claim 1, wherein said logic means comprises an adder adding said base and said offset.

7. The data encoding device according to claim 1, wherein the encoding/decoding device includes a data decoding device comprising:

shift means for shifting variable-length coded data based on a code length of a corresponding code word;

first holding means for holding data outputted from said shift means;

second holding means for holding minimum or maximum values of the code words having respective code lengths defined in said encoding/decoding table;

comparison means for comparing data held in said first holding means with values of code words held in said second holding means; and decoding means for decoding a code length of a code word corresponding to said data from the comparison result of said comparison means.

8. The data encoding device according to claim 7, wherein the second storage means is used as the second holding means.

9. A data encoder device for use with an encoding/decoding device that transforms data that includes a plurality of continuous coefficients Into a variable-length code based on a run length and a group number, the data encoder comprising:

a memory storing a size representing a code length for each code word of each of a plurality of code words and an offset representing a numerical difference between a base and each of the plurality of code words, the base representing a minimum or maximum value In the code words having a code length represented by this size, for all code words having respective code lengths defined in an encoding/decoding table, the memory outputting said size and said offset based on said run length and the group number;

a group of registers storing minimum or maximum values of the code words having respective code lengths defined in said encoding/decoding table;

a multiplexer outputting a minimum or maximum value in the code words having a code length designated by said size out of the group of registers and said base; and an adder adding said base and said offset.

10. The data encoding device according to claim 9, wherein the encoding/decoding device includes a data decoder comprising:

a shifter that shifts variable-length coded data based on the code length for each code word corresponding to this data;

a flip-flop that holds data outputted from said shifter;

a group of registers that holds minimum or maximum values of code words having respective code lengths defined in said encoding/decoding table;

a group of comparators that compares data held in said flip-flop with minimum or maximum values in respective code words hold in said group of registers; and a decoder that decodes said code length for each code word corresponding to said data from a comparison result from said comparators;

wherein the group of registers of said data encoder may be used as a group of registers for said data decoder.

11. The data encoding device according to claim 9, wherein said multiplexer selects and outputs a minimum or maximum value in code words having a code length designated by said size an said base, from respective outputs of said group of registers by using said size as a selection signal.

12. A data encoder device for use with an encoding/decoding device that transforms data composed of a plurality of continuous coefficients into a variable-length code based on a run length and a group number, the data encoder, comprising:

a memory device that stores a size representing a code length for each code word of each of a plurality of code words and an offset representing a numerical difference between a base and each of a plurality of code words, the base representing a minimum or maximum value in code words, the code words having a code length represented by the size, outputting said size and said offset that are stored in an address designated by said run length and the group number;

a multiplexer device outputting a minimum or maximum value in code words having a code length which is defined in said predetermined encoding/decoding table and designated by said size, as said base; and an adder adding said base and said offset.

* * * * *